(12) United States Patent
Leenders et al.

(10) Patent No.: US 7,864,292 B2
(45) Date of Patent: *Jan. 4, 2011

(54) LITHOGRAPHIC APPARATUS AND DEVICE MANUFACTURING METHOD

(75) Inventors: Martinus Hendrikus Antonius Leenders, Rotterdam (NL); Nicolaas Rudolf Kemper, Eindhoven (NL); Joost Jeroen Ottens, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 324 days.

This patent is subject to a terminal disclaimer.

(21) Appl. No.: 11/404,091

(22) Filed: Apr. 14, 2006

(65) Prior Publication Data

US 2007/0109513 A1 May 17, 2007

Related U.S. Application Data

(63) Continuation-in-part of application No. 11/274,888, filed on Nov. 16, 2005, and a continuation-in-part of application No. 11/391,683, filed on Mar. 29, 2006.

(51) Int. Cl.
*G03B 27/42* (2006.01)
(52) U.S. Cl. ....................................................... 355/53
(58) Field of Classification Search .................... 355/30, 355/53; 430/5
See application file for complete search history.

(56) References Cited

U.S. PATENT DOCUMENTS

| | | | | |
|---|---|---|---|---|
| 3,573,975 A | 4/1971 | Dhaka et al. | ................. | 117/212 |
| 3,648,587 A | 3/1972 | Stevens | .......................... | 95/44 |
| 4,346,164 A | 8/1982 | Tabarelli et al. | .............. | 430/311 |
| 4,390,273 A | 6/1983 | Loebach et al. | .............. | 355/125 |
| 4,396,705 A | 8/1983 | Akeyama et al. | ............. | 430/326 |
| 4,480,910 A | 11/1984 | Takanashi et al. | .............. | 355/30 |
| 4,509,852 A | 4/1985 | Tabarelli et al. | | |
| 5,040,020 A | 8/1991 | Rauschenbach et al. | ........ | 355/53 |
| 5,121,256 A | 6/1992 | Corle et al. | .................. | 359/664 |
| 5,610,683 A | 3/1997 | Takahashi | ..................... | 355/53 |
| 5,825,043 A | 10/1998 | Suwa | .......................... | 250/548 |
| 5,900,354 A | 5/1999 | Batchelder | ................... | 430/395 |

(Continued)

FOREIGN PATENT DOCUMENTS

| | | |
|---|---|---|
| DE | 206 607 | 2/1984 |
| DE | 221 563 | 4/1985 |
| DE | 224 448 | 7/1985 |
| DE | 242 880 | 2/1987 |
| EP | 0023231 | 2/1981 |

(Continued)

OTHER PUBLICATIONS

International Search Report issued for International Patent Application No. PCT/GB2006/004275, dated Apr. 4, 2007.

(Continued)

*Primary Examiner*—Hung Henry Nguyen
*Assistant Examiner*—Steven H Whitesell-Gordon
(74) *Attorney, Agent, or Firm*—Pillsbury Winthrop Shaw Pittman LLP

(57) ABSTRACT

An immersion lithographic apparatus is disclosed in which at least a part of the liquid supply system (which provides liquid between the projection system and the substrate) is moveable in a plane substantially parallel to a top surface of the substrate during scanning. The part is moved to reduce the relative velocity between that part and the substrate so that the speed at which the substrate may be moved relative to the projection system may be increased.

30 Claims, 6 Drawing Sheets

U.S. PATENT DOCUMENTS

| | | | |
|---|---|---|---|
| 6,191,429 B1 | 2/2001 | Suwa | 250/548 |
| 6,236,634 B1 | 5/2001 | Lee et al. | 369/112 |
| 6,600,547 B2 | 7/2003 | Watson et al. | 355/30 |
| 6,603,130 B1 | 8/2003 | Bisschops et al. | 250/492.1 |
| 6,809,794 B1 | 10/2004 | Sewell | 355/30 |
| 2002/0020821 A1 | 2/2002 | Van Santen et al. | 250/492 |
| 2002/0163629 A1 | 11/2002 | Switkes et al. | 355/53 |
| 2003/0123040 A1 | 7/2003 | Almogy | 355/69 |
| 2004/0000627 A1 | 1/2004 | Schuster | 250/201.2 |
| 2004/0075895 A1 | 4/2004 | Lin | 359/380 |
| 2004/0114117 A1 | 6/2004 | Bleeker | 355/53 |
| 2004/0136494 A1 | 7/2004 | Lof et al. | |
| 2004/0160582 A1 | 8/2004 | Lof et al. | 355/30 |
| 2004/0165159 A1 | 8/2004 | Lof et al. | 355/30 |
| 2004/0207824 A1 | 10/2004 | Lof et al. | |
| 2004/0211920 A1 | 10/2004 | Derksen et al. | 250/492.1 |
| 2004/0239954 A1 | 12/2004 | Bischoff | 356/635 |
| 2004/0263809 A1 | 12/2004 | Nakano | 355/30 |
| 2005/0007569 A1 | 1/2005 | Streefkerk et al. | 355/30 |
| 2005/0018155 A1 | 1/2005 | Cox et al. | 355/30 |
| 2005/0024609 A1 | 2/2005 | De Smit et al. | 355/18 |
| 2005/0030497 A1 | 2/2005 | Nakamura | 355/30 |
| 2005/0030498 A1* | 2/2005 | Mulkens | 355/30 |
| 2005/0046813 A1 | 3/2005 | Streefkerk et al. | 355/30 |
| 2005/0046934 A1 | 3/2005 | Ho et al. | 359/380 |
| 2005/0052632 A1 | 3/2005 | Miyajima | 355/53 |
| 2005/0094116 A1 | 5/2005 | Flagello et al. | 355/53 |
| 2005/0094125 A1 | 5/2005 | Arai | 355/72 |
| 2005/0122505 A1 | 6/2005 | Miyajima | 355/72 |
| 2005/0132914 A1 | 6/2005 | Mulkens et al. | 101/463.1 |
| 2005/0134817 A1 | 6/2005 | Nakamura | 355/53 |
| 2005/0140948 A1 | 6/2005 | Tokita | 355/30 |
| 2005/0146693 A1 | 7/2005 | Ohsaki | 355/30 |
| 2005/0146694 A1 | 7/2005 | Tokita | 355/30 |
| 2005/0151942 A1 | 7/2005 | Kawashima | 355/30 |
| 2005/0200815 A1 | 9/2005 | Akamatsu | 353/53 |
| 2005/0213065 A1 | 9/2005 | Kitaoka | 355/53 |
| 2005/0213066 A1 | 9/2005 | Sumiyoshi | 355/53 |
| 2005/0219489 A1 | 10/2005 | Nei et al. | 355/53 |
| 2005/0233081 A1 | 10/2005 | Tokita | 427/256 |
| 2005/0243292 A1* | 11/2005 | Baselmans et al. | 355/53 |
| 2006/0038968 A1 | 2/2006 | Kemper et al. | |
| 2006/0119807 A1* | 6/2006 | Baselmans et al. | 355/30 |
| 2006/0290909 A1 | 12/2006 | Donders et al. | 355/53 |

FOREIGN PATENT DOCUMENTS

| | | |
|---|---|---|
| EP | 0418427 | 3/1991 |
| EP | 1039511 | 9/2000 |
| EP | 1 420 300 A2 | 5/2004 |
| EP | 1477856 A1 * | 11/2004 |
| EP | 1 489 462 A2 | 12/2004 |
| EP | 1 420 300 A3 | 8/2005 |
| EP | 1 489 462 A3 | 6/2006 |
| EP | 1 739 488 A1 | 1/2007 |
| EP | 1 830 394 A1 | 9/2007 |
| EP | 1 933 371 A1 | 6/2008 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| JP | 2006-237291 A | 9/2006 |
| WO | 99/49504 | 9/1999 |
| WO | WO 99/49504 | 9/1999 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/090577 | 10/2004 |
| WO | WO 2004/090633 | 10/2004 |
| WO | WO 2004/090634 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | WO 2004107048 A2 * | 12/2004 |
| WO | WO 2005/010611 | 2/2005 |
| WO | WO 2005/024517 | 3/2005 |

OTHER PUBLICATIONS

M. Switkes et al., "Immersion Lithography at 157 nm", MIT Lincoln Lab, Orlando 2001-1, Dec. 17, 2001.

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths To Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040, (2003).

Nikon Precision Europe GmbH, "Investor Relations—2003 Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future Fab International, vol. 15, Jul. 11, 2003.

H. Kawata et al., "Fabrication of 0.2µm Fine Patterns Using Optical Projection Lithography with an Oil Immersion Lens", Jpn. J. Appl. Phys. vol. 31 (1992), pp. 4174-4177.

G. Owen et al., "1/8µm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International Sematech, Los Angeles, Jan. 27-29, 2004, Slide Nos. 1-51.

H. Hata, "The Development of Immersion Exposure Tools", Litho Forum, International Sematech, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial λ/NA scaling equations for resolution, depth of focus, and immersion lithography, *J. Microlith., Microfab., Microsyst.* 1(1):7-12 (2002).

European Office Action for European Application No. 06 808 564.6-2222 dated Nov. 30, 2009.

Notification of Reason(s) for Refusal for Japanese Patent Application No. 2006-310702 dated Feb. 23, 2010.

* cited by examiner

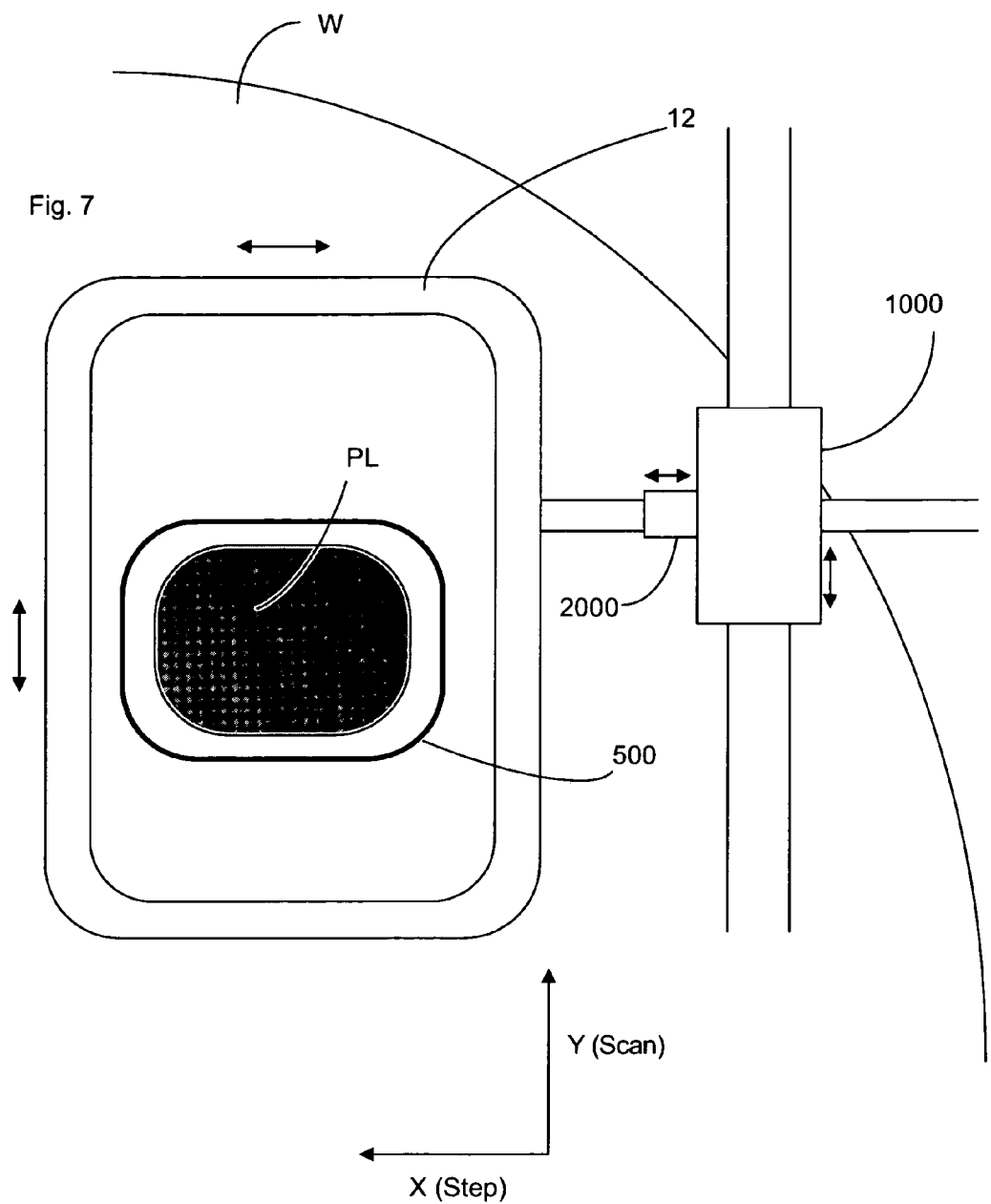

Fig. 8a
Fig. 8b
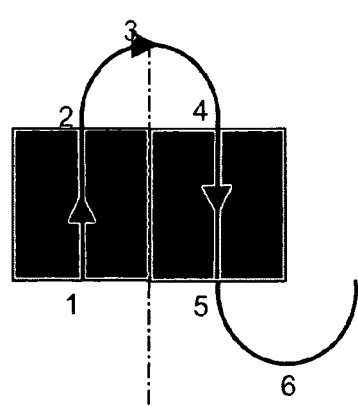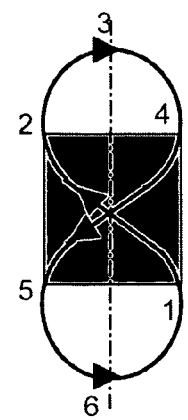
Fig. 8c
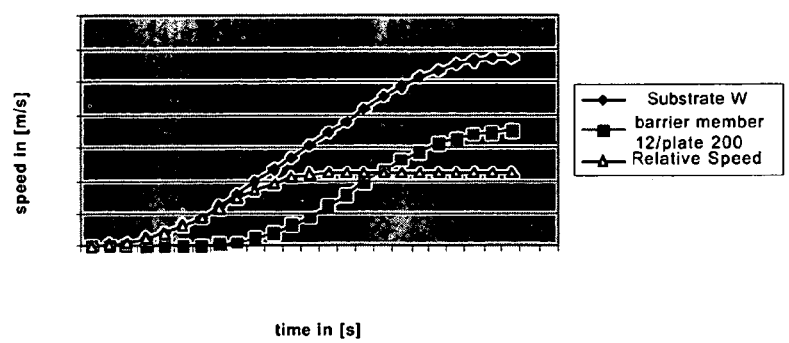

speed of chuck and IH at step (NP2 dual exposure)

LITHOGRAPHIC APPARATUS AND DEVICE MANUFACTURING METHOD

RELATED APPLICATIONS

This application is a continuation-in-part application of co-pending U.S. patent application Ser. No. 11/274,888, filed Nov. 16, 2005, and of co-pending U.S. patent application Ser. No. 11/391,683, filed Mar. 29, 2006, the entire contents of each application is hereby incorporated by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication WO 99/49504. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Another immersion lithography solution with a localized liquid supply system solution which has been proposed is to provide the liquid supply system with a barrier member which extends along at least a part of a boundary of the space between the final element of the projection system and the substrate table. Such a solution is illustrated in FIG. 5. The barrier member is substantially stationary relative to the projection system in the XY plane though there may be some relative movement in the Z direction (in the direction of the optical axis). In an embodiment, a seal is formed between the barrier member and the surface of the substrate and may be a contactless seal such as a gas seal.

The barrier member 12 at least partly contains liquid in the space 11 between a final element of the projection system PL and the substrate W. A contactless seal 16 to the substrate may be formed around the image field of the projection system so that liquid is confined within the space between the substrate surface and the final element of the projection system. The space is at least partly formed by the barrier member 12 positioned below and surrounding the final element of the projection system PL. Liquid is brought into the space below the projection system and within the barrier member 12 by liquid inlet 13 and may be removed by liquid outlet 13. The barrier member 12 may extend a little above the final element of the projection system and the liquid level rises above the final element so that a buffer of liquid is provided. The barrier member 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The liquid is contained in the space 11 by a gas seal 16 which, during use, is formed between the bottom of the barrier member 12 and the surface of the substrate W. The gas seal is formed by gas, e.g. air or synthetic air but, in an embodiment, $N_2$ or another inert gas, provided under pressure via inlet 15 to the gap between barrier member 12 and substrate and extracted via outlet 14. The overpressure on the gas inlet 15, vacuum level on the outlet 14 and geometry of the gap are arranged so that there is a high-velocity gas flow inwards that confines the liquid. Those inlets/outlets may be annular grooves which surround the space 11 and the flow of gas 16 is effective to contain the liquid in the space 11. Such a system is disclosed in U.S. patent application publication no. US 2004-0207824, hereby incorporated in its entirety by reference.

In European patent application publication no. EP 1420300 and U.S. patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

A possible downside of immersion lithography is reduced throughput due to liquid handling issues.

SUMMARY

It is desirable, for example, to provide a lithographic projection apparatus and device manufacturing method using immersion lithography in which one or more measures are taken to increase throughput.

According to an aspect of the invention, there is provided a lithographic apparatus, comprising:
 a projection system;
 a table configured to hold a substrate to be imaged by the projection system; and
 a liquid supply system configured to provide a space between the projection system and the substrate with liquid, at least a part of the liquid supply system being moveable relative to and independent of the projection system and the substrate in at least one direction which is substantially parallel to a top surface of the substrate.

According to an aspect of the invention, there is provided a lithographic apparatus, comprising:
 a projection system;
 a table configured to hold a substrate to be imaged by the projection system; and
 a liquid supply system comprising a barrier member, surrounding the projection system, configured to at least partly contain liquid in a volume including a space between the projection system and the substrate,
 wherein the barrier member is configured to be moveable independently of the substrate in a first direction in a plane substantially parallel to a top surface of the substrate, and
 wherein the barrier member is sized and shaped such that it is moveable in the first direction by at least a distance equal to a slit height of the lithographic apparatus.

According to an aspect of the invention, there is provided a lithographic apparatus, comprising:
 a projection system;
 a table configured to hold a substrate to be imaged by the projection system;
 a liquid supply system configured to provide a space between the projection system and the substrate with liquid; and
 a force decoupling member, positioned around the projection system and, in use, in the liquid, to at least reduce transfer of forces from the liquid supply system to the projection system through the liquid.

According to an aspect of the invention, there is provided a device manufacturing method, comprising:
 providing a liquid between a projection system and a substrate using a liquid supply system, part of which forms a seal between it and the substrate;
 using the projection system to project a patterned beam of radiation onto the substrate;
 moving the substrate under the projection system; and
 during moving of the substrate, moving the part of the liquid supply system in a direction and at a speed to reduce the relative velocity between the substrate and the part.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 7 illustrates, in plan, the liquid supply system of FIG. 6;

FIGS. 8a-c illustrate schematically movements of a substrate and a part of a liquid supply system under the projection system.

DETAILED DESCRIPTION

Figure 1:
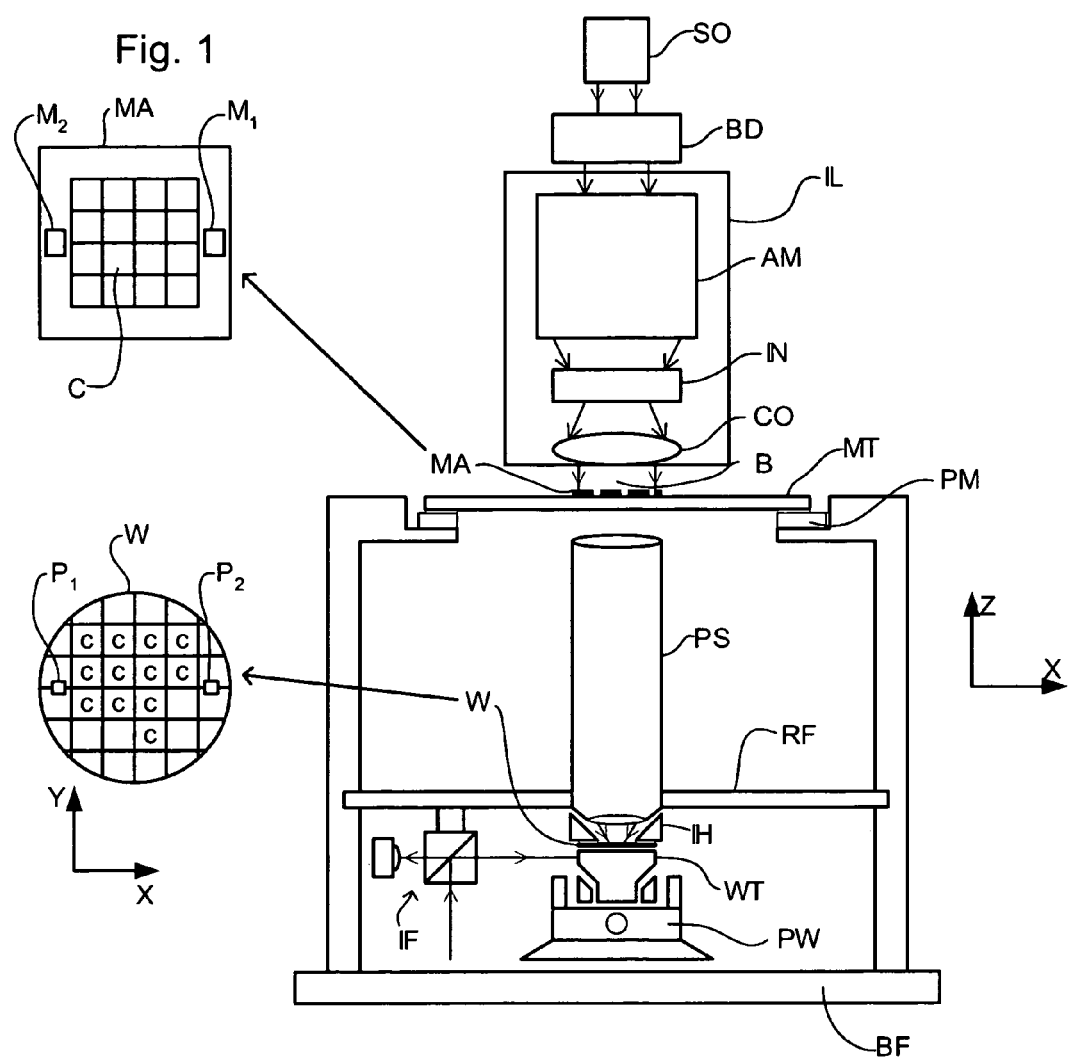
FIG. 1 depicts a lithographic apparatus according to an embodiment of the invention.
Figure 2:
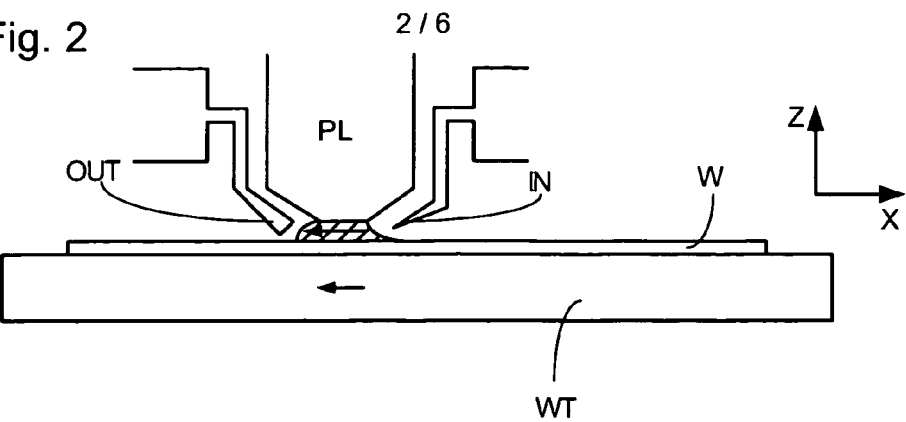
FIGS. 2 and 3 depict a liquid supply system for use in a lithographic projection apparatus.
Figure 3:
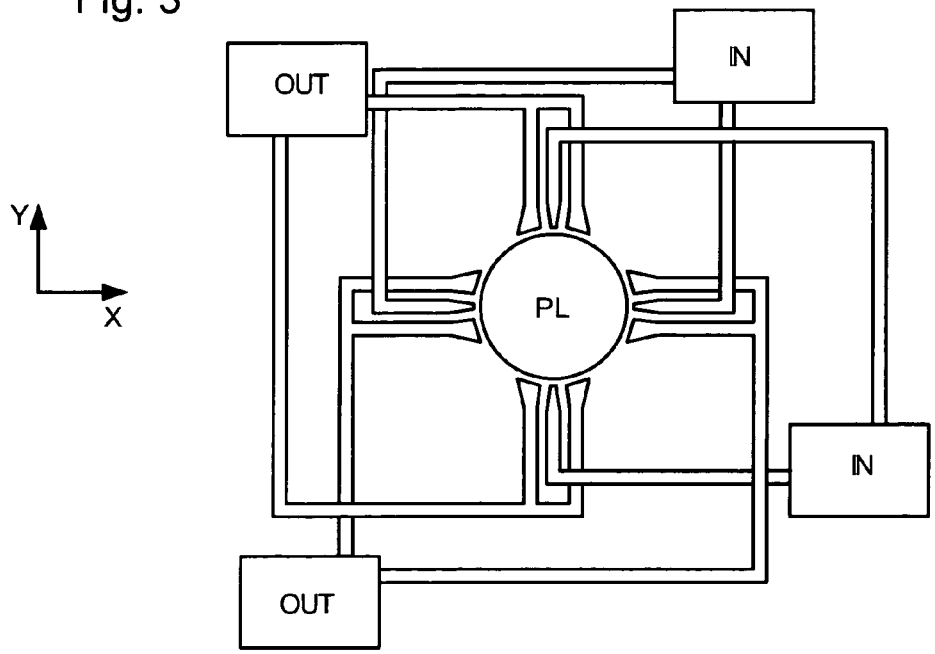
Figure 4:
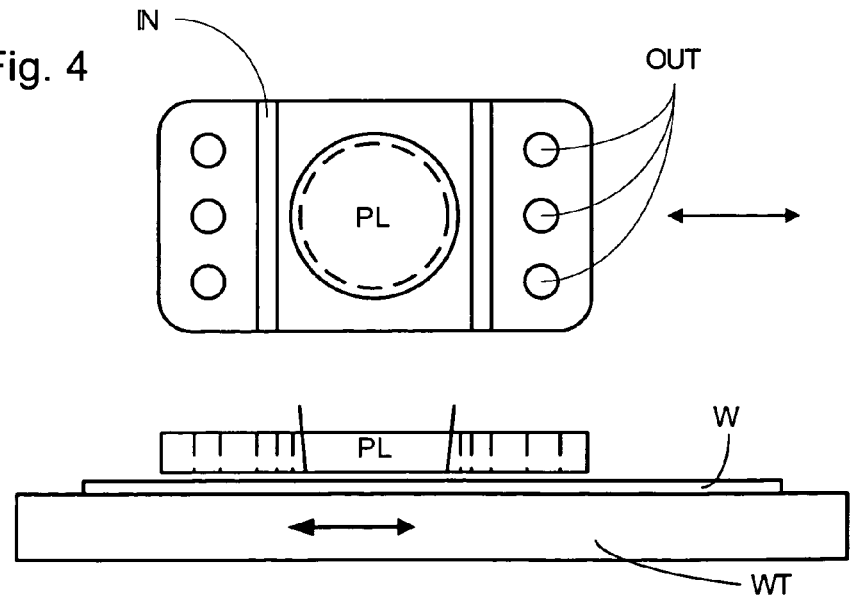
FIG. 4 depicts another liquid supply system for use in a lithographic projection apparatus.

FIG. 1 schematically depicts a lithographic apparatus according to one embodiment of the invention. The apparatus comprises:
 an illumination system (illuminator) IL configured to condition a radiation beam B (e.g. UV radiation or DUV radiation);
 a support structure (e.g. a mask table) MT constructed to support a patterning device (e.g. a mask) MA and connected to a first positioner PM configured to accurately position the patterning device in accordance with certain parameters;
 a substrate table (e.g. a wafer table) WT constructed to hold a substrate (e.g. a resist-coated wafer) W and connected to a second positioner PW configured to accurately position the substrate in accordance with certain parameters; and
 a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 5:
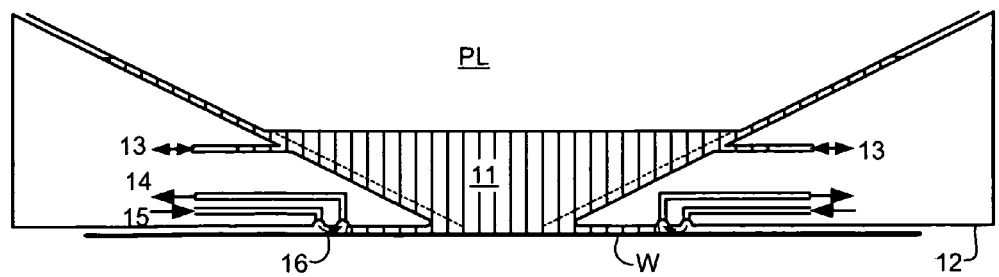
FIG. 5 illustrates, in cross-section, a barrier member with a gas seal formed between the liquid supply system and the substrate.

One or more embodiments of the present invention are applicable to all types of liquid supply system which have a speed at which the liquid may no longer be contained sufficiently. In particular those types which contain the liquid in a volume above the substrate and which at least partly rely on capillary forces and/or an underpressure and/or gas pressure and/or hydrodynamic forces and/or friction between the liquid and the substrate, etc. to help ensure that liquid does not escape that volume. Examples of such liquid supply systems are illustrated in FIGS. 2-6 and other types of liquid supply system may also make use of one or more embodiments of the present invention, including those which use a gas knife to contain the liquid e.g. as depicted in FIG. 5. An embodiment of the present invention will be described in relation to the liquid supply system illustrated in FIG. 6 which comprises a barrier member 12. However, it will be understood that this and other embodiments may also be applicable to other types of liquid supply system, and particularly those which provide a liquid to a localized area of a substrate and to those relative to which the substrate moves during imaging of the substrate.

Various types of liquid supply system attempt to create a seal between a part of the liquid supply system and a substrate. Movement of the substrate relative to that part of the liquid supply system may lead to breakdown of the seal and thereby cause leaking of liquid. In an embodiment of the present invention, one or more measures are taken to reduce the relative velocity between that part of the liquid supply system and the substrate W during imaging. In this way the scanning speed of the substrate W at which the seal may break down is increased so as to allow faster movement of the substrate W under the projection system and thereby possibly increase throughput.

Figure 6:
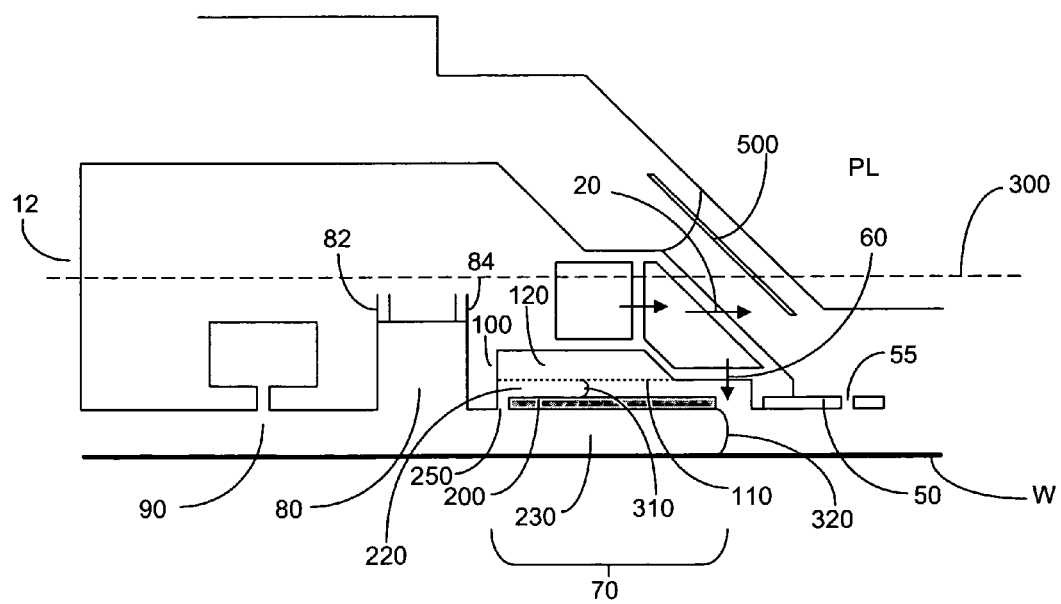
FIG. 6 illustrates, in cross-section, a further liquid supply system in accordance with an embodiment of the present invention.

FIG. 6 illustrates a barrier member 12 which is part of a liquid supply system. The barrier member 12 extends around the periphery of the final element of the projection system PL such that the barrier member (which is sometimes called a seal member) is, for example, substantially annular in overall shape. The projection system PL may not be circular and the inner and/or outer edge of the barrier member 12 may also not be circular so that it is not necessary for the barrier member to be ring shaped and it could also be other shapes (as described with reference to FIG. 7) so long as it has a central opening through which the projection beam may pass out of the final element of the projection system PL through liquid contained in the central opening and onto the substrate W.

As illustrated in FIG. 7 the barrier member 12 may be, for example, substantially rectangular and is not necessarily the same shape as the final element of the projection system PL is at the height of the barrier member 12 (illustrated by line 300 in FIG. 6). The significance of what is illustrated in FIG. 7 will be described below in more detail.

A function of the barrier member 12 is to at least partly maintain or confine liquid in the space between the projection system PL and the substrate W so that the projection beam may pass through the liquid. The top level of liquid is simply contained by the presence of the barrier member and the level of liquid in the space is maintained such that the liquid does not overflow over the top of the barrier member 12. In an embodiment, a seal is provided between the bottom of the barrier member 12 and the substrate W. In FIG. 6 the seal is a contactless seal and is made up of several components. Working radially outwardly from the optical axis of the projection system PL, there is provided a (optional) flow plate 50 which extends into the space (though not into the path of the projection beam) which helps maintain substantially parallel flow of the immersion liquid out of outlet 20 across the space. The flow control plate has through holes 55 in it to reduce the resistance to movement in the direction of the optical axis of the barrier member 12 relative to the projection system PL and/or substrate W. Moving radially outwardly along the bottom of the barrier member 12 there is then provided an outlet 60 which provides a flow of liquid in a direction substantially parallel to the optical axis towards the substrate. This flow of liquid is used to help fill any gaps between the edge of the substrate W and the substrate table WT which holds the substrate. If this gap is not filled with liquid, bubbles may be included in the liquid in the space between the projection system PL and the substrate W when an edge of the substrate W passes under the seal. This is undesirable as it may lead to deterioration of the image quality.

Radially outwardly of the outlet 60 is an extractor assembly 70 configured to extract liquid from between the barrier member 12 and the substrate W. The extractor 70 will be described in more detail below and is configured to form, in part, the contactless seal which is created between the barrier member 12 and the substrate W.

Radially outwardly of the extractor assembly is a recess 80 which is connected through an inlet 82 to the atmosphere and via an outlet 84 to a low pressure source. Radially outwardly of the recess 80 is a gas knife 90. An arrangement of the extractor, recess and gas knife is disclosed in detail in U.S. patent application 60/643,626, filed Jan. 14, 2005, incorporated herein its entirety by reference. However, in that application the arrangement of the extractor assembly is different.

The extractor assembly 70 is comprised of a liquid removal device or extractor or inlet 100 such as the one disclosed in United States patent application publication US 2006-0038968, incorporated herein its entirety by reference. Any type of liquid extractor may be used. In an embodiment, the liquid removal device 100 comprises an inlet which is covered in a porous material 110 which is used to separate liquid from gas to enable single-liquid phase liquid extraction. A chamber 120 downstream of the porous material 110 is maintained at a slight under pressure and is filled with liquid. The under pressure in the chamber 120 is such that the meniscuses formed in the holes of the porous material prevent ambient gas being drawn into the chamber 120 of the liquid removal device 100. However, when the porous surface 110 comes into contact with liquid there is no meniscus to restrict flow and the liquid can flow freely into the chamber 120 of the liquid removal device 100. The porous surface 110 extends radially inwardly along the barrier member 12 (as well as around the space) and its rate of extraction varies according to how much of the porous material 110 is covered by liquid.

Control of the meniscus of liquid between the barrier member 12 and the substrate W is significant. During scanning of the substrate W (during which the substrate moves under the barrier member 12 and projection system PL) the meniscus may be drawn either towards or away from the optical axis by a drag force applied by the moving substrate W. This may lead to liquid loss which may result in evaporation of the liquid and thereby possible cooling of the substrate and consequent shrinkage and overlay errors. Additionally or alternatively, liquid stains may be left behind from interaction between the liquid droplets and resist photochemistry. Additionally or alternatively, inclusion of gas into the space between the projection system PL and the substrate W may be a problem which may lead to bubbles and deterioration in the quality of the projected image when the meniscus is dragged into the space.

In an embodiment, a plate 200 is provided between the liquid removal device 100 and the substrate W so that the function of liquid extraction and the function of meniscus control may be separated from one another and the barrier member 12 may be optimized for each.

The plate 200 is a divider or any other element which has the function of splitting the space between the liquid removal device 100 and the substrate W into two channels, an upper channel 220 and a lower channel 230 wherein the upper channel 220 is between the upper surface of the plate 200 and the liquid removal device 100 and the lower channel 230 is between the lower surface of the plate 200 and the substrate W. Each channel is open, at its radially innermost end, to the space. The thickness of the plate is not critical. Although as illustrated in FIG. 6 the upper channel 220 extends horizontally, this is not necessarily the case. The reason for the upper channel 220 extending horizontally in FIG. 6 is because of the structural arrangement of the components. However, the upper channel 220 could also extend vertically or any where between horizontally and vertically. The gravitational pressure on the liquid in the upper channel 220 is low and, if necessary, may be counteracted by applying an under pressure, for example through liquid removal device 100 itself or through another passage such as breathing holes 250 described below.

In an embodiment, the upper channel 220 between the liquid removal device 100 and the plate 200 is narrower than the lower channel 230 between the plate 200 and the substrate W. In an embodiment, the lower channel is between 250 mm and 50 µm high, or between 100 and 60 µm depending on design (viscous drag length from flow pattern), fluid parameters (viscosity, density, surface tension) and surface properties (contact angle resulting from binding energy surface/ liquid and liquid surface tension). The upper channel 220 has a stronger capillary action, for instance by making it 2 to 3 times narrower than the lower channel 230. Alternatively or additionally, the upper channel 220 may be made with a surface which is more liquidphilic than the lower channel 230. The upper channel 220 may also be wider than the lower channel 230. If the upper channel 220 is too narrow, liquid may not flow in that channel because the frictional resistance is too large and the meniscus in that channel is fully loaded with hydrodynamic forces. Thus, if the upper channel 220 is made wider, for example in the region of 150 µm, than the lower channel 230 which could be perhaps 60 µm, these difficulties may be overcome. Above a channel width of 250 µm the capillary action is reduced. In order to promote capillary action, the upper channel 220 could be made liquidphilic or a height step close to the meniscus in the upper channel 220 may be made such that the channel radially inwardly is wider than radially outwardly.

An under pressure may be applied in the upper channel 220, rather than leaving it open to the atmosphere through breathing holes 250 e.g. through holes 250. In this way the upper channel 220 may be made wider.

In this way there are two meniscuses 310, 320. A first meniscus 310 is positioned above the plate 200 and extends between the porous surface 110 and the top surface of the plate 200 and a second meniscus 320 which is positioned underneath the plate 200 and which extends between the plate 200 and the substrate W. In this way the extractor assembly 70 may be optimized to control the first meniscus 310 for optimum extraction of liquid and to control the position of the second meniscus 320 such that the viscous drag length for the second meniscus 320 is reduced. In particular, characteristics, such as of the plate 200, may be optimized to make it energetically favorable for the second meniscus 320 to remain adhered to the plate 200 such that the scan speed of the substrate W beneath the barrier member 10 may be increased. Capillary forces acting on the second meniscus 320 are outwards and are balanced by an under pressure in the liquid adjacent the meniscus so that the meniscus stays still. Higher loading on the meniscus, for example by viscous drag and inertia, may result in a lowering of the contact angle of the meniscus with the surface.

In FIG. 6 the basic extractor assembly 70 is illustrated. Breathing holes 250 are provided at the radially outward most end of the plate 200 such that the first meniscus 310 is free to move inwardly and outwardly beneath the porous material 110 so that the extraction rate of the liquid removal device 100 can vary according to how much of the porous material 110 is covered by liquid. As illustrated in FIG. 6 the second meniscus 320 is adhered to a lower innermost edge of the plate 200.

In FIG. 6 the innermost bottom edge of the plate 200 is provided with a sharp edge so as to substantially pin the second meniscus 320 in place. In an embodiment, the radius of the edge is less than 0.1 mm, less than 50 µm, less than 20 µm or about 10 µm.

An alternative or additional way of pinning the second meniscus 320 is to change the surface properties of the surface of the plate 200 to which the second meniscus 320 adheres. For example, a change from a liquidphilic to a liquidphobic surface in a radially outward direction on the plate 200 could also result in substantial pinning of the meniscus 320 at that change because the shape of the meniscus will need to invert for it to pass from the liquidphilic to the liquidphobic surface. Another or additional way to pin the meniscus is to change the surface of the plate 200 from a rough surface to a smooth surface. When fully wetted the rough surface can act as a meniscus trap. If the surface is not fully wetted and the liquid is only on the peaks of the roughness, a rough surface can act liquidphobic such as in the so called lotus effect. Additionally or alternatively, electro wetting could be used to locally trap the meniscus, which has an advantage in that it can be turned on and off.

Also illustrated in FIG. 6 is a force decoupling member (e.g., ring) 500. This force decoupling member 500 surrounds the final element of the projection system PL in the liquid. The purpose of the force decoupling member 500 is to substantially prevent forces being transmitted from the part of the liquid supply system which moves relative to the projection system PL (see below) to the final element through the liquid. To this end the force decoupling member 500 is attached either to a base frame BF which supports the substrate W or to a metrology frame RF to which the projection system PS is attached. Thus the force decoupling member 500 is dynamically isolated from the projection system PL.

Although not specifically illustrated in FIG. 6, the liquid supply system has a means for dealing with a variation in the level of the liquid. This is so that liquid which builds up between the projection system PL and the barrier member 12 may be dealt with and does not spill. Such a build-up of liquid might occur during relative movement of the barrier member 12 to a projection system PL described below. One way of dealing with this liquid is to provide the barrier member 12 so that it is very large so that there is hardly any pressure gradient over the periphery of the barrier member 12 during movement of the barrier member 12 relative to the projection system PL. In an alternative or additional arrangement, liquid may be removed from the top of the barrier member 12 using, for example, an extractor such as a single phase extractor similar to the extractor 110.

In an embodiment, it is possible to regulate the supply of liquid into the space between the final element of the projection system PL and substrate W, for example, through outlet 20, depending on the relative direction of movement of the barrier member 12 relative to the projection system PL. Thus active control of the supply of liquid by the liquid supply system into the space is possible depending on the movement of the barrier member 12 relative to the projection system PL. Thus, for example, when the barrier member 12 is moving towards the projection system PL from a first side to a second side the active control of the liquid control system would provide more liquid from the side of the barrier member closer to the second side than from a part of the barrier member closer to the first side. The active control could be implemented by way of piezoelectric actuated inlet nozzles, or concentric rings moveable with respect to each other with a flow path between the inside edge of the outer ring and the outside edge of the inner ring, etc.

FIG. 7 illustrates how it is possible to reduce the relative speed between the substrate W and the barrier member 12 of the liquid supply system and thereby increase the speed at which the substrate may be moved below the projection system. This is accomplished by providing the barrier member 12 of the liquid supply system of a size such that the barrier member 12 may be moved relative to the projection system PL and independently of the substrate W. This is achieved by shaping and sizing the barrier member 12 to define an inner volume which is, in plan, larger than the size, in plan, of the final element of the projection system PL at the same height as the barrier member 12 (line 300 in FIG. 6). The final element may be cone shaped like illustrated in FIGS. 5 and 6 and therefore larger in plan above the barrier member 12 than the inner volume.

As illustrated in FIG. 7, in an embodiment, the barrier member is sized and shaped such that it is moveable in at least one direction (the scanning direction) in a plane substantially parallel to a top surface of the substrate. The barrier member should be moveable by at least a distance which gives a tangible improvement in performance. For example, sizing and shaping the barrier member 12 such that it is moveable in a first direction at least a distance equal to a slit height of the apparatus would be appropriate. The slit of an apparatus is the size, in plan, of the aperture through which the projection beam PB passes. Generally the slit has a height of about 10 mm and a width of about 25 mm. During scanning the slit width is scanned and the scan length is about 32 mm. During a scanning movement, the substrate table WT is accelerated for approximately 20 mm in order to reach a stable velocity. Scanning for approximately 32 mm then occurs at that stable velocity before deceleration of the table for about 20 mm happens. Thus the total travel of a substrate table WT during a scanning motion is of the order of 70-80 mm. Allowing the barrier member 12 to move in the scanning direction by 20% of that distance should produce a noticeable increase in through-put performance and would be suitable. Clearly increasing the amount of movement will reduce the relative velocity between the substrate W and the barrier member 12, more so that allowing the barrier member 12 to be moveable in the first (scanning) direction by a distance of at least 30, 40 or 50% of a maximum scan length of the apparatus is correspondingly better at the cost of a larger footprint.

With regard to movement in the step direction, it might be suitable to allow movement in that direction by at least a distance equal to the slit height or perhaps the slit width. A step is approximately 25 mm in width and acceleration of approximately 26 mm is typically used beforehand in order to stabilize the substrate table and deceleration of approximately 26 mm is typically used afterwards. Thus the amount of movement possible in the second (step) direction should be a reasonable fraction of that distance, for example 20%, 30%, 40% or 50% of the step travel distance.

The barrier member 12 may move either passively (for example against a spring force) or actively by use of an actuator 1000 for movement in one direction (scanning) and a second actuator 2000 for movement in the direction orthogonal to the scanning direction.

When the substrate W moves to the right hand side as illustrated in FIG. 6, the barrier member 12 is also moved to the right hand side at a speed equal to two times the speed of the substrate W or less. Both these movements are relative to the projection system PL. In this relative speed range, the speed difference between the substrate W and barrier member 12, the plate 200 in particular, is reduced. For example if the barrier member 12 is moved at half the velocity of the substrate W this means that the maximum scan speed at which the lower meniscus 320 may break is increased by a factor of 2 because the relative speed between the substrate and the plate is reduced by half. The upper meniscus 310 experiences little or no movement. Lower speeds of the barrier member 12, say up to a speed equal to the substrate, should provide the same benefits as higher speeds up to twice the speed of the substrate but are easier to implement.

In practice the barrier member may move at any speed or direction which reduces the relative velocity between the sealing surface of the plate 200 and the substrate W. During scanning in order to prevent cumulative movement in a certain direction the barrier member 12 is only moved during the fast movements of the substrate W and may then be brought back gradually to a centered position during slower movement or during periods where there is no movement. Thus, during Y scans the barrier member 12 may simply move up and down during the meandering and during X steps the barrier member 12 may move with the substrate. During the Y scans the barrier member 12 may move back to its original position to prevent accumulative movement in the X direction.

The movement of the barrier member 12 may be either active or passive. In the case of an active barrier member 12, a control system is provided which interacts with data from the overall controller of the lithographic apparatus to co-ordinate movements of the barrier member 12 with movements of the substrate W. The barrier member 12 may be actuated by, for example a piezo electric actuator, a linear motor, etc. In an embodiment in which the barrier member 12 is moved passively, the barrier member 12 may be attached to the base frame BF, reference frame RF or projection system PL by one or more springs positioning it in the X-Y direction. Friction through the liquid between the moveable plate 200 and the substrate W should provide enough force for the barrier member 12 to be moved in the same direction as the substrate W. By adding a liquidphobic coating at an edge of the plate 200, the force exerted on the plate by the substrate W through the liquid may be increased. The strength of the spring(s) is chosen such that the barrier member 12 moves only during step movements of high speed.

The barrier member is described as being rectangular in the description of the embodiment of FIGS. 6 and 7 and references to radially (i.e. in and out towards the optical axis) are made. The term should be construed generally to encompass movements with geometries other than circular generally away from and towards the optical axis but in some geometries the directions may not exactly pass through the optical axis.

FIGS. 8 and 9 show two practical examples of the moving barrier member 12 described above in which the movement of the barrier member 12 is active i.e. it is moved with actuators 1000, 2000. FIG. 8*a* shows the movement of the substrate W under the projection system PL and FIG. 8*b* shows the movement of the barrier member 12 under the stationary projection system PL. The substrate is scanned under the projection system PL from position 1 to position 2 (FIG. 8*a*) such that the shaded square box is illuminated as the mask is scanned across. During this scanning the barrier member 12 follows (slowly) a diagonal path from position 1 to position 2 (FIG. 8*b*). During the step motion (2-3-4), to reduce the relative speed between the barrier member 12 and substrate W, the barrier member 12 may then also move from left to right as illustrated (2-3-4) in FIG. 8*b*. During the scan from 4-5 another diagonal path is traversed slowly by the barrier member 12 in order that the barrier member is in a position at the end of that scan to move once again in the X direction to reduce the relative speed between the substrate and the barrier member 12 during the X step. FIG. 8*c* illustrates the absolute speeds of the substrate and the barrier member as well as the relative speed between the substrate and the barrier member. From this graph it is easy to see how the moveable barrier member 12 may reduce the relative speed between the substrate W and the barrier member 12 and thereby allow a greater speed of the substrate W leading to possible increased throughput before meniscus breakdown.

Figure 9A:
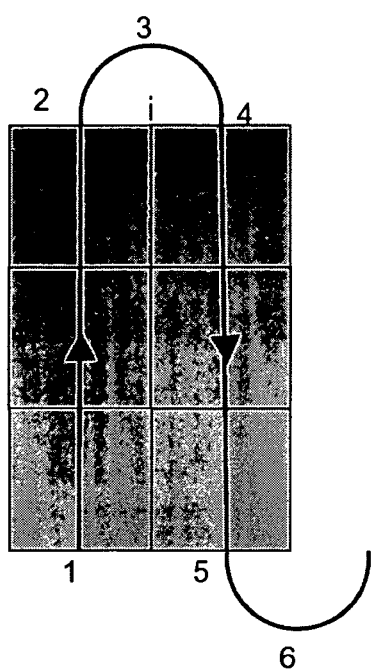
FIGS. 9a-c illustrate schematically movements of a substrate and a part of a liquid supply system under the projection system.
Figure 9B:
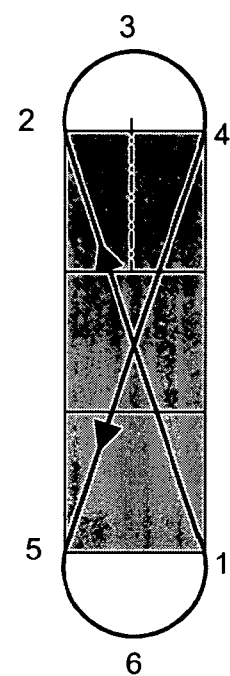
Figure 9C:
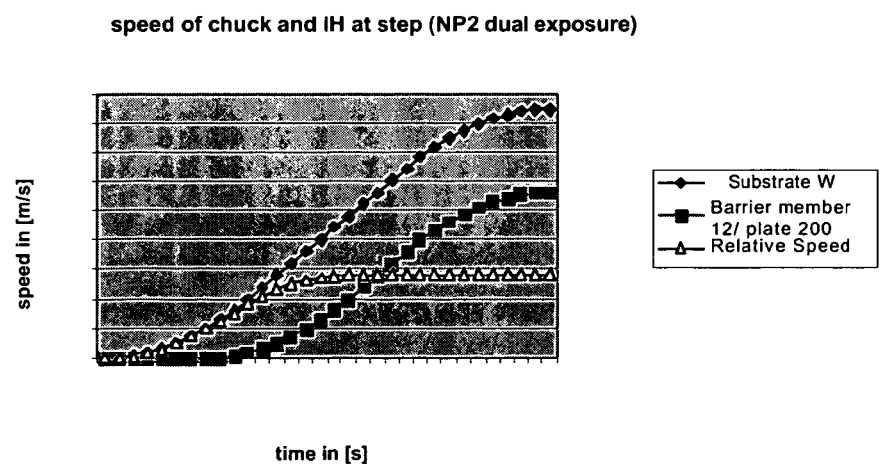

FIGS. 9*a-c* illustrate a similar principle to that illustrated in FIGS. 8*a-c* except for longer scans to allow for double exposure.

For small fields (e.g. 10 mm long), the speed in the scan direction may become smaller than in the step direction. The same applies for a required stroke, it depends upon the use to which the apparatus is being put.

In order to increase modularity, identical actuators may be used for movement of the barrier member 12 in the scanning and step directions and they may have the same stroke.

In an alternative embodiment the plate 200 is dispensed with i.e. one or more embodiments of the invention work just as well with different constructions of barrier member.

In all embodiments, the controller may also predict likely movements required by the sealing surface in the future because it has the data regarding the movement which the substrate will undergo during exposure. Thus, it may, during slow movement of the substrate relative to the projection system, move the barrier member close to an extreme position (or back to a central position) so as to increase or maximize the available movement of the barrier member for a future high speed movement of the substrate relative to the projection system.

In an embodiment, the plate 200 is translatable relative to the barrier member 12 in a plane substantially parallel to the substrate W. In this embodiment, the barrier member 12 itself is not substantially moved relative to the projection system PL during scanning of the substrate but it is the plate 200 which is moved (e.g. as described above in relation to FIGS. 8 and 9) to reduce the relative speed between the substrate W and the plate 200 to which the meniscus 320 is attached.

When the substrate moves to the right hand side as illustrated in FIG. 6, the plate 200 is also moved to the right hand side at a speed equal to two times the speed of the substrate W or less. Both these movements are relative to the projection system PL and barrier member 12. In this relative speed range the speed difference between the substrate W and the plate 200 is reduced. For example if the plate 200 is moved at half the velocity of the substrate W this means that the maximum scan speed at which the lower meniscus 320 may break is increased by a factor of 2 because the relative speed between the substrate and the plate 200 is reduced by half. The upper meniscus 310 only experiences the plate 200 movement. It may be necessary to provide a breathing hole equivalent to breathing hole 250 in the side wall of the barrier member rather than through the plate 200. A lower speed of the plate, say up to a speed equal to the speed of the substrate, may provide the same benefits as a higher speed up to twice the speed of the substrate but is easier to implement.

In practice the plate may move at any speed which reduces the relative velocity between the sealing surface of the plate 200 and the substrate W. During scanning in order to prevent cumulative movement in a certain direction the plate is only moved during the fast movements of the substrate W and may then be brought back gradually to a centered position during slower movement or during periods where there is no movement. Thus, during Y scans the plate may simply move up and down during the meandering and during X steps the plate may move with the substrate. During the Y scans the plate may move back to its original position to prevent accumulative movement in the X direction.

The movement of the plate may be either active or passive. In the case of an active plate a control system is provided which interacts with data from the overall controller of the lithographic apparatus to co-ordinate movements of the plate 200 with movements of the substrate W. The plate 200 may be actuated by, for example a piezo electric actuator, a linear motor, etc. In an embodiment in which the plate is moved passively, the plate may be attached to the barrier member 10 by a spring positioning it in the X-Y direction. Friction through the liquid between the moveable plate 200 and the substrate W will provide enough force for the plate 200 to be moved in the same direction as the substrate W. By adding a liquidphobic coating at an edge of the plate 200, the force exerted on the plate by the substrate W through the liquid may be increased. The strength of the spring may be chosen such that the plate moves only during step movements of high speed.

Thus, as can be seen, by moving a part of the liquid supply system relative to the projection system and independently of the substrate but in the same direction of the substrate during fast movement of the substrate, the speed of movement of the substrate may be increased before liquid leaks from the liquid supply system. In particular the part which is moved is the part to which one end of the meniscus 320, which extends from the substrate W and the liquid supply system, is attached. Thus, although an embodiment of the invention has been described in relation to moving the whole of the barrier member 12 or the plate 200 relative to the projection system PL there may be other designs of liquid supply system in which a different part or member of the liquid supply system may be moved relative to the projection system PL to achieve the same effect as described above. As described above, an embodiment of the invention has been described above in relation to two particular types of barrier member liquid supply systems. There are other liquid supply systems to which an embodiment of the present invention may also be applied e.g. barrier member solutions without a plate 200 and/or with a gas knife to contain the liquid.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The immersion liquid used in the apparatus may have different compositions, according to the desired properties and the wavelength of exposure radiation used. For an exposure wavelength of 193 nm, ultra pure water or water-based compositions may be used and for this reason the immersion liquid is sometimes referred to as water and water-related terms such as hydrophilic, hydrophobic, humidity, etc. may be used.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, comprising:
a projection system;
a table configured to hold a substrate to be imaged by the projection system;
a liquid supply system configured to provide a space between the projection system and the substrate with liquid, at least a part of the liquid supply system being linearly translateable with respect to the projection system in at least one direction which is substantially parallel to a top surface of the substrate and linearly translateable independent of the projection system and the substrate; and
a positional controller configured to control linear translation of the at least a part of the liquid supply system such that, during a portion of movement of the substrate relative to the projection system during imaging, the at least a part of the liquid supply system is linearly translated to reduce relative velocity between the at least a part of the liquid supply system and the substrate, while maintaining the space between the projection system and the substrate substantially full of liquid.

2. The apparatus of claim 1, further comprising an actuator configured to linearly translate the at least a part of the liquid supply system in the at least one direction.

3. The apparatus of claim 1, wherein, in use, a boundary of the liquid extends between the substrate and the at least a part of the liquid supply system.

4. The apparatus of claim 3, wherein the boundary is a meniscus.

5. The apparatus of claim 1, wherein the liquid supply system comprises a gas knife configured to seal between the liquid supply system and substrate to at least partly contain liquid in the space.

6. The apparatus of claim 1, wherein the liquid supply system is configured to provide liquid to an area of the substrate which is, in plan, smaller than a top surface of the substrate.

7. The apparatus of claim 1, wherein, in use, movement of the at least a part of the liquid supply system in the at least one direction is effective to move a volume, to which the at least a part of the liquid supply system provides liquid, in the at least one direction.

8. The apparatus of claim 1, further comprising a substrate table configured to hold the substrate and move it relative to the projection system independent of movement of the at least a part of the liquid supply system.

9. The apparatus of claim 1, wherein the positional controller is configured to control linear translation of the at least a part of the liquid supply system, during a scanning of the substrate under the projection system in a scanning direction, with a major component in the scanning direction and a minor component in a direction substantially orthogonal to the scanning direction, such that the at least a part of the liquid supply system moves during the scan from a position to one side of the projection system to a position toward the other side of the projection system in a direction substantially orthogonal to the scanning direction.

10. The apparatus of claim 1, wherein the positional controller is configured to control linear translation of the at least a part of the liquid supply system, during a step motion of the substrate under the projection system in a step direction, in the step direction.

11. The apparatus of claim 1, wherein the at least a part of the liquid supply system is configured to form a contactless seal between the liquid supply system and the substrate.

12. The apparatus of claim 11, wherein the at least a part of the liquid supply system comprises a barrier member configured to surround the space and provide a physical barrier to liquid escaping radially outwardly from an optical axis of the apparatus from the space and wherein, in use, the contactless seal is provided between the barrier member and the substrate.

13. The apparatus of claim 11, wherein, in use, the contactless seal at least partly relies on a meniscus force of the liquid.

14. The apparatus of claim 1, further comprising a first actuator configured to move the at least a part of the liquid supply system in a second direction substantially orthogonal to the at least one direction.

15. The apparatus of claim 1, wherein the at least a part of the liquid supply system comprises a plate.

16. The apparatus of claim 1, wherein the at least a part of the liquid supply system comprises a liquid supply part or the liquid supply system.

17. The apparatus of claim 1, further comprising a force decoupling member, positioned around the projection system and, in use, in the liquid, to at least reduce transfer of forces from the part of the liquid supply system to the projection system through the liquid.

18. The apparatus of claim 17, wherein, in use, the force decoupling member is dynamically decoupled from the projection system.

19. The apparatus of claim 17, wherein the force decoupling member is attached to a frame to which the projection system is attached or attached to a frame configured to support the substrate.

20. A lithographic apparatus, comprising:
a projection system;
a table configured to hold a substrate to be imaged by the projection system;
a liquid supply system configured to provide a space between the projection system and the substrate with liquid, at least a part of the liquid supply system being linearly translateable with respect to the projection system in at least one direction which is substantially parallel to a to surface of the substrate and linearly translateable independent of the projection system and the substrate;
a first actuator configured to move the at least a part of the liquid supply system in a second direction substantially orthogonal to the at least one direction; and
a second actuator configured to linearly translate the at least a part of the liquid supply system in the at least one direction and wherein the stroke of the second actuator is at least 1½ times the stroke of the first actuator.

21. A lithographic apparatus, comprising:
a projection system;
a table configured to hold a substrate to be imaged by the projection system; and
a liquid supply system comprising a barrier member, surrounding the projection system, configured to at least partly contain liquid in a volume including a space between the projection system and the substrate,
wherein the barrier member is configured to be moveable independently of the substrate in a first direction in a plane substantially parallel to a top surface of the substrate, and
wherein the barrier member is sized and shaped such that it is moveable in the first direction by at least a distance equal to a slit height of the lithographic apparatus.

22. The apparatus of claim 21, wherein the barrier member is sized and shaped such that it is moveable in a second direction substantially orthogonal to the first direction and in a plane substantially parallel to the top surface of the substrate by at least a distance equal to the slit height of the lithographic apparatus.

23. The apparatus of claim 21, wherein the barrier member is sized and shaped such that it is moveable by more distance in the first direction than it is moveable in a second direction.

24. The apparatus of claim 21, wherein the barrier member is sized and shaped such that it is moveable in the first direction by a distance of at least 20% of a maximum scan length of the lithographic apparatus.

25. The apparatus of claim 21, wherein the barrier member is sized and shaped such that it is moveable in a second direction by a distance of at least 20% of the slit width of the apparatus.

26. A lithographic apparatus, comprising:
a projection system;
a table configured to hold a substrate to be imaged by the projection system;
a liquid supply system configured to provide a space between the projection system and the substrate with liquid; and
a force decoupling member, positioned around the projection system and not in direct contact with the projection system and, in use, in the liquid, to at least reduce transfer of forces from the liquid supply system to the projection system.

27. The apparatus of claim 26, further comprising a base frame configured to support the substrate and wherein the force decoupling member is attached to the base frame.

28. A device manufacturing method, comprising:
providing a liquid between a projection system and a substrate using a liquid supply system, part of which forms a seal between the liquid supply system and the substrate;
using the projection system to project a patterned beam of radiation onto the substrate;
moving the substrate under the projection system; and
during moving of the substrate, moving the part of the liquid supply system in a direction with a component perpendicular to the optical axis of the projection system and at a speed to reduce the relative velocity between the substrate and the part, wherein the part of the liquid supply system is not supported by a substrate table holding the substrate.

29. The method of claim 28, wherein during scanning movement of the substrate in a scanning direction, the part is moved with a major component in the scanning direction and a minor component in a direction substantially orthogonal to the scanning direction, such that the part moves during the scan from a position to one side of the projection system to a position toward the other side of the projection system in a direction substantially orthogonal to the scanning direction.

30. The method of claim 28, wherein, during a step motion of the substrate under the projection system in a step direction, the part is moved in the step direction.

* * * * *